United States Patent
Ueba et al.

(10) Patent No.: US 11,901,156 B2
(45) Date of Patent: Feb. 13, 2024

(54) MULTI-CHARGED-PARTICLE-BEAM WRITING APPARATUS AND MULTI-CHARGED-PARTICLE-BEAM WRITING METHOD

(71) Applicant: NuFlare Technology, Inc., Yokohama (JP)

(72) Inventors: Ryosuke Ueba, Yokohama (JP); Satoru Hirose, Yokohama (JP); Shunsuke Isaji, Kouza-gun (JP); Rieko Nishimura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 18 days.

(21) Appl. No.: 17/815,701

(22) Filed: Jul. 28, 2022

(65) Prior Publication Data

US 2023/0081240 A1  Mar. 16, 2023

(30) Foreign Application Priority Data

Sep. 14, 2021 (JP) ................. 2021-149612

(51) Int. Cl.
*H01J 37/317* (2006.01)
*H01J 37/04* (2006.01)
(Continued)

(52) U.S. Cl.
CPC ........ *H01J 37/3177* (2013.01); *H01J 37/045* (2013.01); *H01J 37/1471* (2013.01); *H01J 37/3045* (2013.01); *H01J 2237/0435* (2013.01)

(58) Field of Classification Search
CPC .. H01J 37/3177; H01J 37/045; H01J 37/1471; H01J 37/3045; H01J 2237/0435
See application file for complete search history.

(56) References Cited

U.S. PATENT DOCUMENTS 9,715,993 B2   7/2017 Inoue
10,269,532 B2  4/2019 Matsumoto
(Continued)

FOREIGN PATENT DOCUMENTS

JP   5-299327 A    11/1993
JP   2016-103571 A  6/2016
(Continued)

OTHER PUBLICATIONS

Combined Taiwanese Office Action and Search Report dated Jun. 28, 2023 in Taiwanese Patent Application No. 111129709, (with unedited computer-generated English translation of Office Action only), 14 pages.

*Primary Examiner* — Sean M Luck
(74) *Attorney, Agent, or Firm* — Oblon, McClelland, Maier & Neustadt, L.L.P.

(57) ABSTRACT

In one embodiment, a multi-charged-particle-beam writing method includes performing a tracking operation such that, while a substrate placed on a stage moving continuously is being irradiated with multiple beams including a plurality of charged particle beams, deflection positions of the multiple beams follow movement of the stage, and applying the multiple beams to the substrate having a writing area including a plurality of rectangular regions arranged in a mesh during the tracking operation such that each of the plurality of rectangular regions is irradiated with the multiple beams. Each rectangular region includes a plurality of pixels each having a predetermined size and arranged in a mesh. At least one subset of the plurality of pixels is irradiated with the multiple beams in a first shot order and is then irradiated with the multiple beams in a second shot order different from the first shot order.

12 Claims, 8 Drawing Sheets

(51) Int. Cl.
*H01J 37/147* (2006.01)
*H01J 37/304* (2006.01)

(56) References Cited

U.S. PATENT DOCUMENTS

| | | |
|---|---|---|
| 10,978,273 B2 | 4/2021 | Inoue |
| 2013/0320230 A1* | 12/2013 | Yoshikawa ......... H01J 37/3177 |
| | | 250/398 |
| 2017/0229280 A1* | 8/2017 | Kato .................... H01J 37/147 |
| 2018/0166254 A1* | 6/2018 | Matsumoto ......... H01J 37/3007 |
| 2018/0307144 A1* | 10/2018 | Kato ....................... G03F 7/705 |
| 2019/0198294 A1 | 6/2019 | Inoue |
| 2021/0005422 A1 | 1/2021 | Nakashima |

FOREIGN PATENT DOCUMENTS

| | | |
|---|---|---|
| JP | 2017-220491 A | 12/2017 |
| JP | 2019-114748 A | 7/2019 |
| TW | 201738663 A | 11/2017 |
| TW | 201937523 A | 9/2019 |

\* cited by examiner

| #7 | #5 | #3 | #1 |
|----|----|----|----|
| #7 | #5 | #3 | #1 |
| #7 | #5 | #3 | #1 |
| #7 | #5 | #3 | #1 |

| 4 | 8 | 12 | 16 |
|---|---|----|----|
| 3 | 7 | 11 | 15 |
| 2 | 6 | 10 | 14 |
| 1 | 5 | 9  | 13 |

| #1 | #3 | #5 | #7 |
|----|----|----|----|
| #3 | #6 | #7 | #4 |
| #6 | #8 | #4 | #2 |
| #8 | #5 | #2 | #1 |

| 16 | 12 | 8  | 4  |
|----|----|----|----|
| 11 | 6  | 3  | 10 |
| 5  | 2  | 9  | 14 |
| 1  | 7  | 13 | 15 |

FIRST SHOT ORDER J1

| 93 | 68 | 99 | 74 | 80 | 55 | 81 | 56 | 87 | 62 |
|----|----|----|----|----|----|----|----|----|----|
| 18 | 43 | 24 | 49 | 5  | 30 | 6  | 31 | 12 | 37 |
| 85 | 60 | 86 | 61 | 92 | 67 | 98 | 73 | 79 | 54 |
| 10 | 35 | 11 | 36 | 17 | 42 | 23 | 48 | 4  | 29 |
| 97 | 72 | 78 | 53 | 84 | 59 | 90 | 65 | 91 | 66 |
| 22 | 47 | 3  | 28 | 9  | 34 | 15 | 40 | 16 | 41 |
| 89 | 64 | 95 | 70 | 96 | 71 | 77 | 52 | 83 | 58 |
| 14 | 39 | 20 | 45 | 21 | 46 | 2  | 27 | 8  | 33 |
| 76 | 51 | 82 | 57 | 88 | 63 | 94 | 69 | 100| 75 |
| 1  | 26 | 7  | 32 | 13 | 38 | 19 | 44 | 25 | 50 |

SECOND SHOT ORDER J2

| 43 | 18 | 49 | 24 | 30 | 5  | 31 | 6  | 37 | 12  |
|----|----|----|----|----|----|----|----|----|-----|
| 68 | 93 | 74 | 99 | 55 | 80 | 56 | 81 | 62 | 87  |
| 35 | 10 | 36 | 11 | 42 | 17 | 48 | 23 | 29 | 4   |
| 60 | 85 | 61 | 86 | 67 | 92 | 73 | 98 | 54 | 79  |
| 47 | 22 | 28 | 3  | 34 | 9  | 40 | 15 | 41 | 16  |
| 72 | 97 | 53 | 78 | 59 | 84 | 65 | 90 | 66 | 91  |
| 39 | 14 | 45 | 20 | 46 | 21 | 27 | 2  | 33 | 8   |
| 64 | 89 | 70 | 95 | 71 | 96 | 52 | 77 | 58 | 83  |
| 26 | 1  | 32 | 7  | 38 | 13 | 44 | 19 | 50 | 25  |
| 51 | 76 | 57 | 82 | 63 | 88 | 69 | 94 | 75 | 100 |

POSITION ERROR OF SHOT ORDER J1
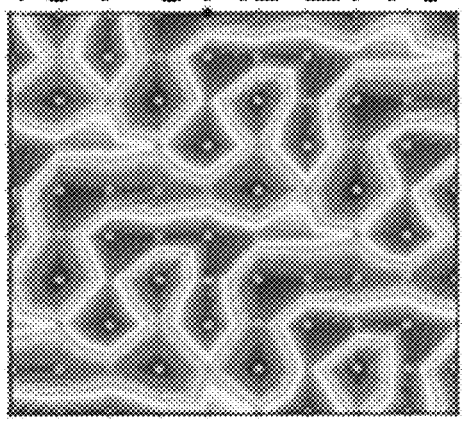
FIG.11
POSITION ERROR OF SHOT ORDER J2
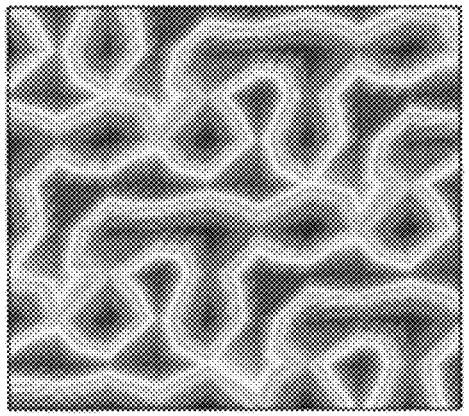
CANCEL

MULTI-CHARGED-PARTICLE-BEAM WRITING APPARATUS AND MULTI-CHARGED-PARTICLE-BEAM WRITING METHOD

CROSS REFERENCE TO RELATED APPLICATION

This application is based upon and claims benefit of priority from the Japanese Patent Application No. 2021-149612, filed on Sep. 14, 2021, the entire contents of which are incorporated herein by reference.

FIELD

The present invention relates to a multi-charged-particle-beam writing apparatus and a multi-charged-particle-beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus using multiple beams enables irradiation with a large number of beams at a time as compared with writing using a single electron beam, and thus markedly increases throughput. Examples of such multi-beam writing apparatuses include a multi-beam writing apparatus using a blanking aperture array. In such a multi-beam writing apparatus, for example, an electron beam emitted from a single electron gun passes through a shaping aperture array member having multiple apertures, thus forming multiple beams (multiple electron beams). Each of the multiple beams passes through a corresponding one of blankers arranged in a blanking aperture array member. The blanking aperture array member includes pairs of electrodes for individually deflecting the beams, and has an aperture for beam passage between each pair of electrodes. Controlling the pair of electrodes (blanker) to the same potential or to different potentials performs blanking deflection of an electron beam that is to pass through the blanker. The electron beam deflected by the blanker is blocked. The electron beam that has not been deflected is applied to a substrate.

The multi-beam writing apparatus includes a main deflector and a subdeflector to deflect the beams and determine beam irradiation positions on the substrate. The main deflector positions the whole of the multiple beams at predetermined locations on the substrate, and the subdeflector deflects the beams to fill beam pitches.

In such a multi-beam writing apparatus, multiple beams are applied at a time, and beams formed by passing through the same or different apertures of an aperture member are combined or stitched together to write a desired pattern of figure shapes. The shape (hereinafter, also referred to as a "beam shape") of an image of the whole of an array of beams to be applied to the substrate affects the stitching accuracy of written figures. The distortion of the image of the entire array of beams is adjusted by an electronic optical system.

Dose modulation correction has been developed to modulate a dose of each beam so that a distribution of doses applied to a resist exposed to misaligned beams is not affected by the misalignment of the beams. However, this correction leads to a reduction in throughput and its effects are unclear.

BRIEF DESCRIPTION OF THE DRAWINGS

FIG. 11 is a diagram illustrating cancelation of the errors.

DETAILED DESCRIPTION

In one embodiment, a multi-charged-particle-beam writing method includes performing a tracking operation such that, while a substrate placed on a stage moving continuously is being irradiated with multiple beams including a plurality of charged particle beams, deflection positions of the multiple beams follow movement of the stage, and applying the multiple beams to the substrate having a writing area including a plurality of rectangular regions arranged in a mesh during the tracking operation such that each of the plurality of rectangular regions is irradiated with the multiple beams. Each rectangular region includes a plurality of pixels each having a predetermined size and arranged in a mesh. At least one subset of the plurality of pixels is irradiated with the multiple beams in a first shot order and is then irradiated with the multiple beams in a second shot order different from the first shot order.

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
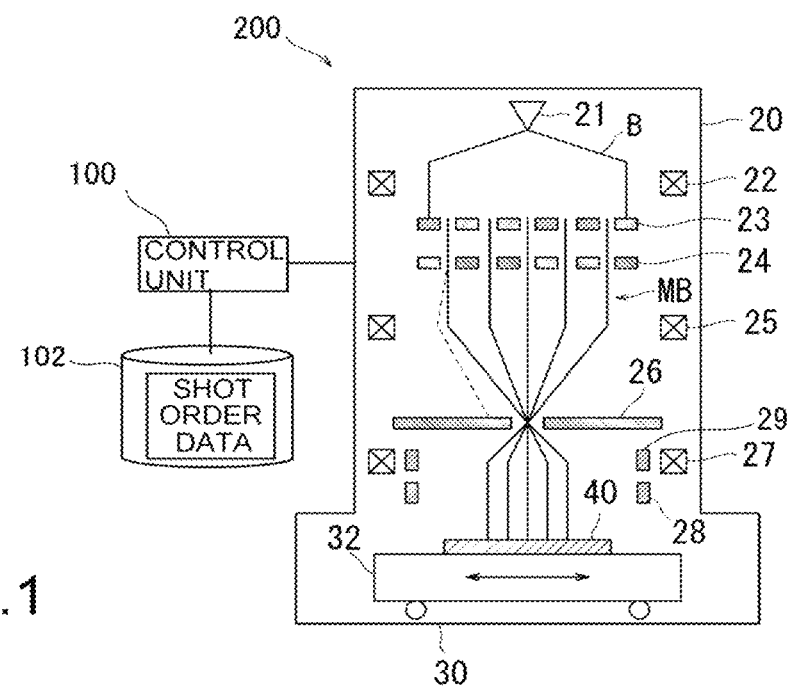
FIG. 1 is a schematic diagram illustrating the configuration of a writing apparatus according to an embodiment of the present invention.

FIG. 1 is a schematic diagram illustrating the configuration of a writing apparatus according to an embodiment. The writing apparatus includes a control unit 100, a storage unit 102, and a writing unit 200. The writing apparatus is an example of a multi-charged-particle-beam writing apparatus. The writing unit 200 includes an electron optical column 20 and a writing chamber 30. The electron optical column 20 contains, for example, an electron gun 21, an illumination lens 22, a shaping aperture array member 23, a blanking plate 24, a reduction lens 25, a limiting aperture member 26, an objective lens 27, a deflector 28, and a deflector 29. Each of the reduction lens 25 and the objective lens 27 is configured as an electromagnetic lens. The reduction lens 25 and the objective lens 27 constitute a reduction optical system.

The writing chamber 30 contains an XY stage 32. A writing target substrate 40 is placed on the XY stage 32. Examples of the substrate 40 include an exposure mask used to fabricate a semiconductor device, a semiconductor substrate (silicon wafer) on which semiconductor devices are to be fabricated, and mask blanks that are coated with resist and that have not yet been subjected to writing.

Figure 2:
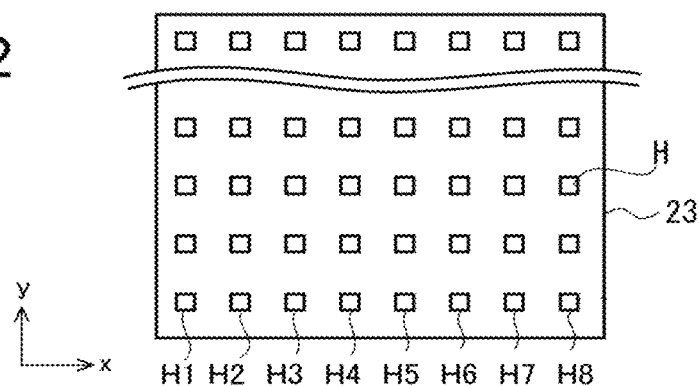
FIG. 2 is a plan view of a shaping aperture array member.

As illustrated in FIG. 2, the shaping aperture array member 23 has apertures H arranged in an array of m rows by n columns (m, n≥2) at a predetermined arrangement pitch. The apertures H have the same shape and dimensions, and are rectangular. The apertures H may have a circular shape.

An electron beam B emitted from the electron gun 21 is applied substantially perpendicularly to the entire shaping aperture array member 23 through the illumination lens 22. The electron beam B passes through the multiple apertures H of the shaping aperture array member 23, thus forming electron beams (multiple beams) MB in an array of m rows by n columns.

The blanking plate 24 has passage holes aligned with the apertures H of the shaping aperture array member 23. Each passage hole has two paired electrodes (blanker: blanking deflector). A control voltage is applied to one of the two electrodes for each beam, and the other electrode is grounded. Each of the electron beams passing through the passage holes is independently deflected by a voltage applied to the two paired electrodes. This electron beam deflection achieves blanking control.

The multiple beams MB passing through the blanking plate 24 are reduced by the reduction lens 25, and travel toward a central opening of the limiting aperture member 26. Electron beams deflected by the blankers of the blanking plate 24 are deviated from the central opening of the limiting aperture member 26 and are blocked by the limiting aperture member 26. In contrast, electron beams that have not been deflected by the blankers pass through the central opening of the limiting aperture member 26.

As described above, the limiting aperture member 26 blocks the beams deflected in a beam OFF state by the blankers. The beams formed for a period between the time when the beams enter a beam ON state and the time when the beams are switched to the beam OFF state and passing through the limiting aperture member 26 correspond to beams of one-time shot.

The multiple beams MB passing through the limiting aperture member 26 are focused by the objective lens 27, thus forming a pattern image at a desired reduction ratio. The multiple beams are collectively deflected by the deflectors 28 and 29 and are then applied to the substrate 40. For example, while the XY stage 32 is continuously moving, the deflector 28 (main deflector) performs control such that the beam irradiation positions follow the movement of the XY stage 32.

Ideally, the multiple beams MB applied at a time are arranged at a pitch obtained by multiplying the arrangement pitch of the multiple apertures of the shaping aperture array member 23 by the above-described desired reduction ratio. The writing apparatus performs a writing operation in a raster-scan manner such that shot beams are successively and sequentially applied. To write a desired pattern, the blanking control is performed such that beams necessary for the pattern are in the beam ON state.

Figure 3:
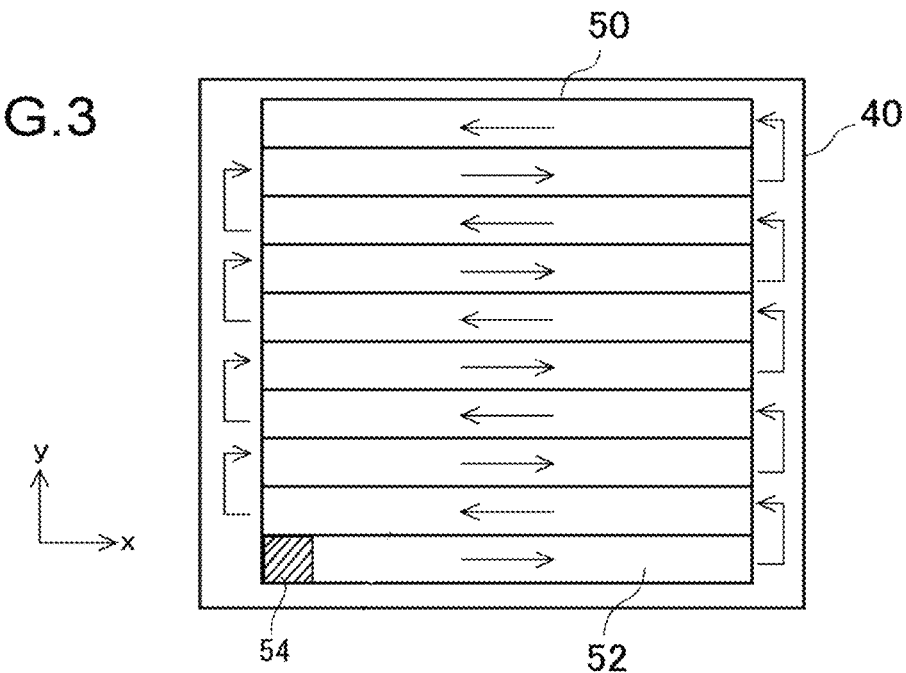
FIG. 3 is a diagram illustrating an exemplary writing operation.

For example, writing is performed based on the following writing algorithm. As illustrated in FIG. 3, a writing area 50 of the substrate 40 is virtually divided into stripe regions 52, each of which has a predetermined width and a strip shape and which are arranged in, for example, the y direction. For example, the XY stage 32 is moved and adjusted such that an irradiation region 54, which can be irradiated with the multiple beams MB at a time, is positioned at the left end of the first stripe region 52. Then, writing is started. Moving the XY stage 32 in the −x direction allows writing to proceed relatively in the +x direction.

After writing in the first stripe region 52, the position of the stage is shifted in the −y direction and is adjusted such that the irradiation region is positioned at the right end of the second stripe region 52. Then, writing is started. Moving the XY stage 32 in, for example, the +x direction allows writing to be performed in the −x direction.

Writing is performed in a zigzag manner such that writing is performed in the third stripe region 52 in the +x direction and such that writing is performed in the fourth stripe region 52 in the −x direction. This writing manner results in a reduction in writing time. The manner of writing is not limited to the above-described zigzag manner. For writing in the stripe regions 52, writing may be performed in the same direction.

Figure 4:
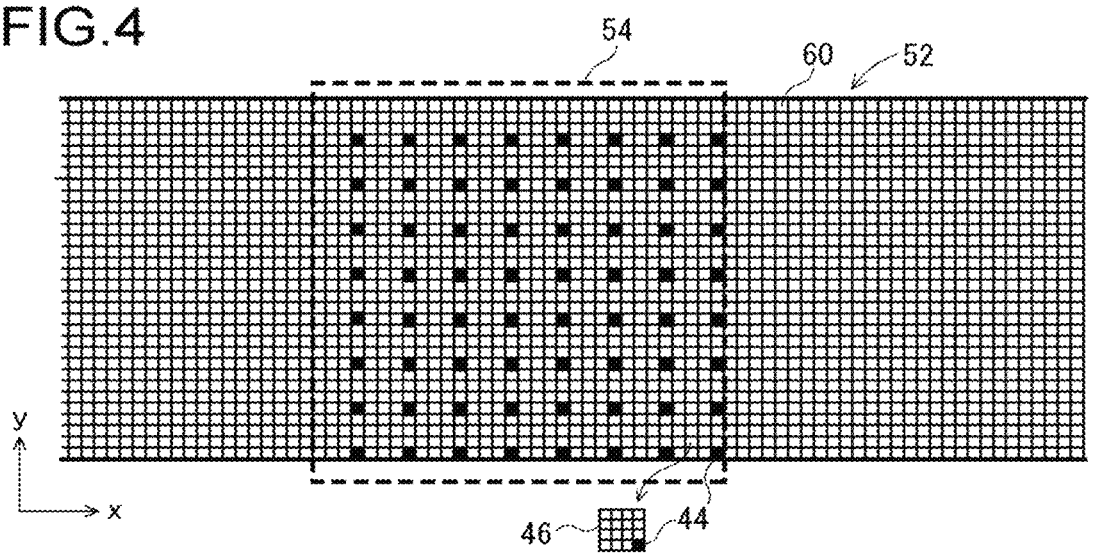
FIG. 4 is a diagram illustrating an exemplary irradiation region for multiple beams and exemplary writing target pixels.

FIG. 4 is a diagram illustrating an exemplary irradiation region for multiple beams and exemplary writing target pixels. In FIG. 4, the stripe region 52 is divided into mesh regions arranged in a mesh and each corresponding to the size of each of the multiple beams, for example. Each mesh region serves as a writing target pixel 60 (unit irradiation region or writing position). The size of the writing target pixel 60 is not limited to the beam size, and may be any size, irrespective of the beam size. For example, the writing target pixel 60 may have a size that is 1/n (n is an integer of 1 or more) of the beam size.

FIG. 4 illustrates an example in which the writing area of the substrate 40 is divided into stripe regions 52 each having a width that is substantially the same as the dimension in, for example, the y direction, of the irradiation region 54 (writing field), which can be irradiated with the multiple beams MB at a time. The width of the stripe region 52 is not limited to this example.

FIG. 4 illustrates the multiple beams in an array of 8×8. In the irradiation region 54, multiple (in this example, 64) pixels 44 (beam writing positions) that can be irradiated with one-time shot of the multiple beams MB are illustrated. A pitch between the adjacent pixels 44 corresponds to a pitch between the beams of the multiple beams. In the example of FIG. 4, a square region that is surrounded by four adjacent pixels 44 and that includes one of the four pixels 44 corresponds to one grid 46. In the example of FIG. 4, each grid 46 is composed of 4×4 pixels.

Figure 5:
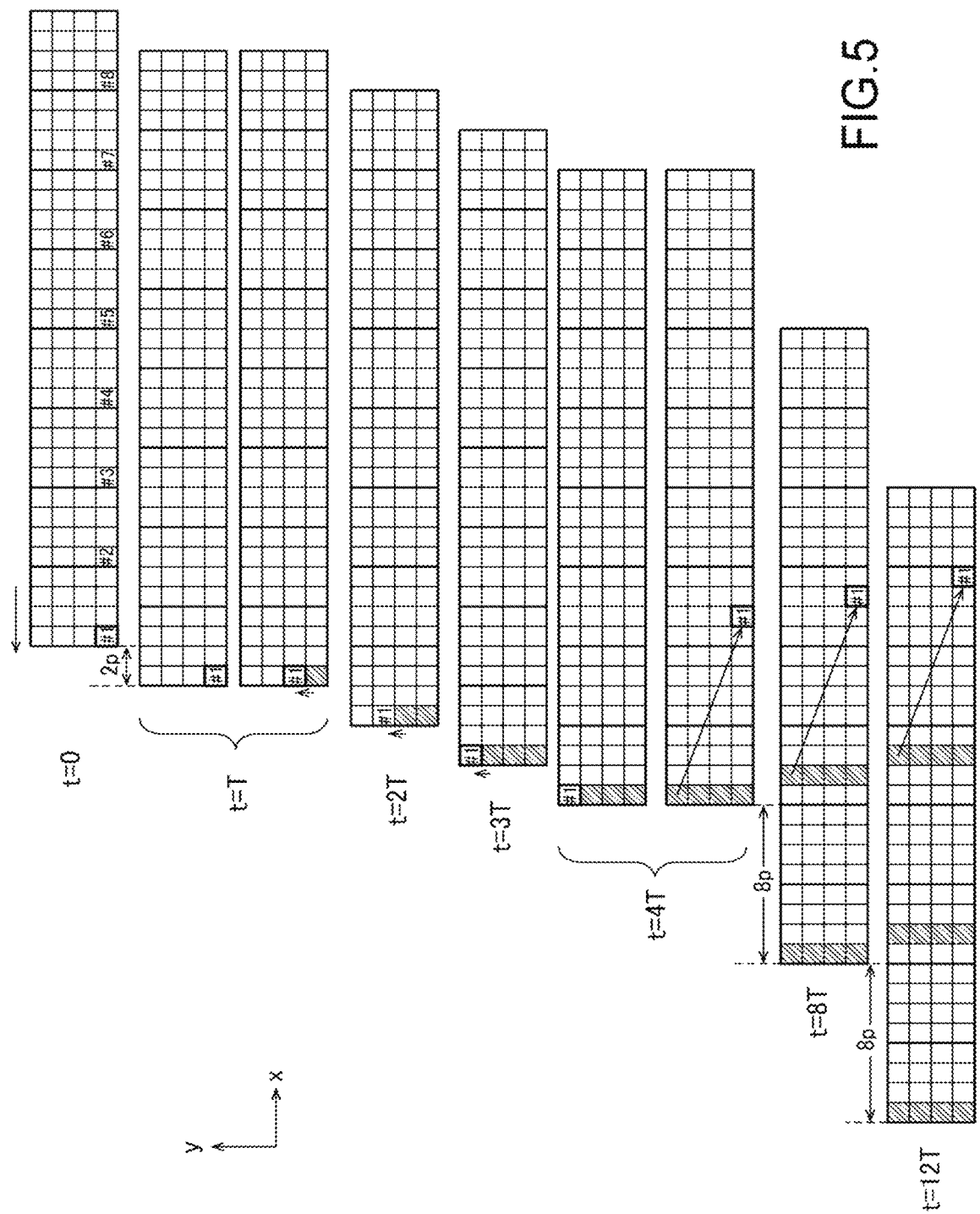
FIG. 5 is a diagram illustrating an exemplary multi-beam writing method.

FIG. 5 is a diagram illustrating an exemplary multi-beam writing method based on continuous movement. FIG. 5 illustrates grids in which writing is performed with eight beams in the first row in the y direction of the multiple beams for writing in the stripe region 52 of FIG. 4. The eight beams in the first row in the y direction are beams that have passed through apertures H1 to H8 of the shaping aperture array member 23 illustrated in FIG. 2.

FIG. 5 illustrates an example in which four pixels are subjected to writing (exposure) while the XY stage 32 is moving a distance of, for example, eight beam pitches (8p).

The deflector 28 collectively deflects the whole of the multiple beams MB so that, while four pixels are being subjected to writing (exposure), the irradiation region 54 is not shifted relative to the substrate 40 by movement of the XY stage 32. Thus, the irradiation region 54 is caused to follow the movement of the XY stage 32. In other words, tracking control is performed. In the example of FIG. 5, one tracking cycle is executed by subjecting four pixels to writing (exposure) during movement over a distance of eight beam pitches.

Let T denotes writing time for each pixel. For example, the first pixel from the left of the bottom row in each of the grids of interest is irradiated with a beam of the first shot for a period from time t=0 to time t=T. The XY stage 32 moves in the −x direction by, for example, two beam pitches (2p), for the period from time t=0 to time t=T. The tracking operation continues for this period. At time t=0 in FIG. 5, the grids are irradiated with beams #1 to #8 that have passed through the apertures H1 to H8 of the shaping aperture array member 23. For the grids at time t=T or later, the positions irradiated with the beam #1 that has passed through the aperture H1 are illustrated for convenience of description. Pixels irradiated with the beam are illustrated by hatching.

At time t=T, the deflector 29 (subdeflector) collectively deflects the multiple beams independently of beam deflection for the tracking control while the beam deflection for the tracking control is being continued by the deflector 28. Thus, the writing positions of the beams are shifted. In the example of FIG. 5, each writing target pixel is shifted from the first pixel from the left in the bottom row of the grid of interest to the first pixel from the left in the second row from the bottom. The tracking operation continues for this period because the XY stage 32 is moving at constant speed.

For a period from time t=T to time t=2T, the first pixel from the left in the second row from the bottom of the grid of interest is irradiated with the beam of the second shot. The XY stage 32 moves in the −x direction by two beam pitches for the period from time t=T to time t=2T. The tracking operation continues for this period.

At time t=2T, the deflector 29 collectively deflects the multiple beams, so that each writing target pixel is shifted from the first pixel from the left in the second row from the bottom of the grid of interest to the first pixel from the left in the third row from the bottom. Since the XY stage 32 is moving, the tracking operation continues for this period.

For a period from time t=2T to time t=3T, the first pixel from the left in the third row from the bottom of the grid of interest is irradiated with the beam of the third shot. The XY stage 32 moves in the −x direction by, for example, two beam pitches, for the period from time t=2T to time t=3T. The tracking operation continues for this period.

At time t=3T, the deflector 29 collectively deflects the multiple beams, so that each writing target pixel is shifted from the first pixel from the left in the third row from the bottom of the grid of interest to the first pixel from the left in the fourth row from the bottom. Since the XY stage 32 is moving, the tracking operation continues for this period.

For a period from time t=3T to time t=4T, the first pixel from the left in the fourth row from the bottom of the grid of interest is irradiated with the beam of the fourth shot. The XY stage 32 moves in the −x direction by, for example, two beam pitches, for the period from time t=3T to time t=4T. The tracking operation continues for this period. Writing on the pixels in the first column from the left of the grid of interest is completed in the above-described manner.

In the example of FIG. 5, after each beam writing position shifted three times from the initial shot position is irradiated with the corresponding one of the beams, the beam deflection for the tracking control is reset, thereby returning a tracking position to a tracking start position. In other words, the tracking position is moved back in a direction opposite to the direction in which the stage moves. In the example of FIG. 5, at time t=4T, the grid of interest is released from tracking, and the beam is deflected to another grid of interest located away in the x direction from the released grid by eight beam pitches. Although FIG. 5 illustrates the beam #1 corresponding to the aperture H1, writing is similarly performed in the grids associated with the other beams.

Writing on the pixels in the first column from the left of each grid is completed. After tracking is reset, the deflector 29 initially deflects the beams in the next tracking cycle such that the beam writing position is adjusted (shifted) to the second pixel from the left in the first row from the bottom of each grid.

For a period from time t=4T to time t=8T, writing is performed on the pixels in the second column from the left of the grid of interest. At time t=8T, the grid of interest is released from tracking, and the beam is deflected to another grid of interest located away in the x direction from the released grid by eight beam pitches.

Writing on the pixels in the first and second columns from the left of each grid is completed. After tracking is reset, the deflector 29 initially deflects the beams in the next tracking cycle such that the beam writing position is adjusted (shifted) to the third pixel from the left in the first row from the bottom of each grid.

For a period from time t=8T to time t=12T, writing is performed on the pixels in the third column from the left of the grid of interest. At time t=12T, the grid of interest is released from tracking, and the beam is deflected to another grid of interest located away in the x direction from the released grid by eight beam pitches.

Writing on the pixels in the first to third columns from the left of each grid is completed. After tracking is reset, the deflector 29 initially deflects the beams in the next tracking cycle such that the beam writing position is adjusted (shifted) to the fourth pixel from the left in the first row from the bottom of each grid.

As described above, the deflector 28 performs control so that the irradiation region 54 is held at the same position relative to the substrate 40 during the same tracking cycle. In this state, each shot of irradiation is performed while the pixels are being shifted one by one through the deflector 29. After completion of one tracking cycle, the tracking position in the irradiation region 54 is returned so that the first shot position of each beam is adjusted to a position shifted by one pixel. During the next tracking control, each shot of irradiation is performed while the pixels are being shifted one by one through the deflector 29.

Repeating the above-described operation writes a pattern. For example, as illustrated in FIG. 6A, one grid is subjected to writing with the beams #1, #3, #5, and #7 corresponding to the apertures H1, H3, H5, and H7 such that the pixels in each column are irradiated with the same beam.

Figures 6A, 6B, 7A, 7B, 7C:
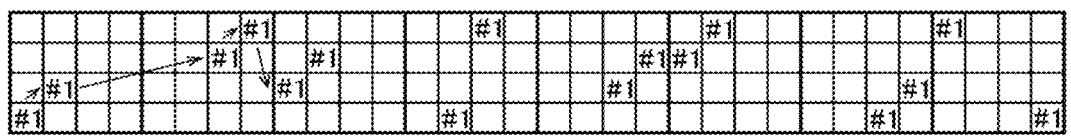
FIG. 6A is a diagram illustrating radiation beams.
FIG. 6B is a diagram illustrating the order of shots.
FIG. 7A is a diagram illustrating an example of shifting a shot position.
FIG. 7B is a diagram illustrating radiation beams.
FIG. 7C is a diagram illustrating the order of shots.

FIG. 6B illustrates the order of shots on the pixels of this grid. The pixels in the first column from the left of the grid are irradiated in sequential order from the bottom with the beam #7. Then, the pixels in the second column from the left of the grid are irradiated in sequential order from the bottom with the beam #5. Then, the pixels in the third column from the left of the grid are irradiated in sequential order from the bottom with the beam #3. After that, the pixels in the fourth column from the left of the grid are irradiated in sequential order from the bottom with the beam #1.

In such a writing process based on the above-described writing algorithm, the control unit 100 reads writing data from a storage device (not illustrated) and calculates a pattern area density ρ of each of the pixels in each stripe region 52 by using a pattern defined in the writing data. The control unit 100 multiplies the pattern area density ρ by a reference dose D0 to calculate a dose ρD0 of a beam to be applied to the pixel 60.

In the examples of FIGS. 5, 6A, and 6B, tracking is reset after completion of writing on the pixels (four pixels) in one column, and writing is then performed on the pixels in the next column. The writing apparatus can use a variety of writing methods.

For example, in a writing method illustrated in FIG. 7A, writing is performed on the first pixel from the left in the bottom row of the grid of interest and the second pixel from the left in the second row from the bottom, and after that, tracking is reset. The beam is deflected to another grid of interest shifted by four beam pitches. While the tracking operation is being performed, writing is performed on the third pixel from the left in the third row from the bottom of this grid and the fourth pixel from the left in the fourth row from the bottom.

Then, tracking is reset. The beam is deflected to the next grid of interest. The writing position is adjusted to the first pixel from the left in the second row from the bottom of the grid. While the tracking operation is being performed, writing is performed on the first pixel from the left in the second row from the bottom of this grid and the second pixel from the left in the third row from the bottom.

For a normal pattern written by this writing method, for example, as illustrated in FIG. 7B, one grid is subjected to writing with the beams #1 to #8 corresponding to the apertures H1 to H8 such that two pixels are irradiated with the same beam. FIG. 7C illustrates the order of shots for the pixels in the grid.

As described above, any number of beams to be applied to one grid and any order of shots for the pixels in the grid can be set.

In multi-beam writing, the difference in beam accuracy between the beams occurs due to the difference in positional accuracy between the apertures H arranged in the shaping aperture array member 23 or distortion of the beam shape (the shape of the image of the entire array of beams). As described above, irradiating one grid with multiple beams or irradiating adjacent pixels with different beams can smooth writing errors caused by the difference in accuracy between the individual beams. However, some pattern-writing positional errors remain.

The present inventor has found that pattern-writing positional errors vary depending on the order of shots for pixels in a grid and that the effects of the writing positional errors can be reduced by irradiating the pixels in the grid with beams in a first shot order and then irradiating the pixels in the same grid with the beams in a second shot order different from the first shot order. For irradiation of a grid with multiple beams, the multiple beams are beams in a certain column of an array of beams and reflect a tendency toward distortion in beam shape. A shot order that reduces errors can be estimated based on the tendency.

Figures 8A, 8B:
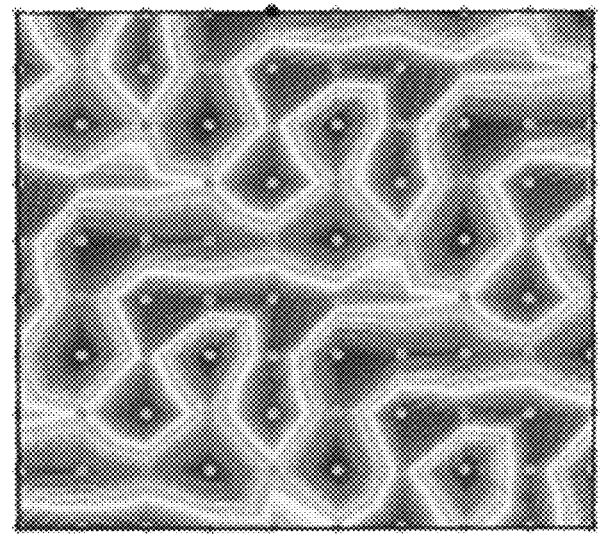
FIG. 8A is a diagram illustrating the order of shots.
FIG. 8B is a diagram illustrating a distribution of writing positional errors.

FIG. 8A illustrates a first shot order J1 for pixels in a grid composed of 10×10 pixels. FIG. 8B illustrates a distribution of writing positional errors in the grid subjected to irradiation in the first shot order J1.

Figures 9A, 9B:
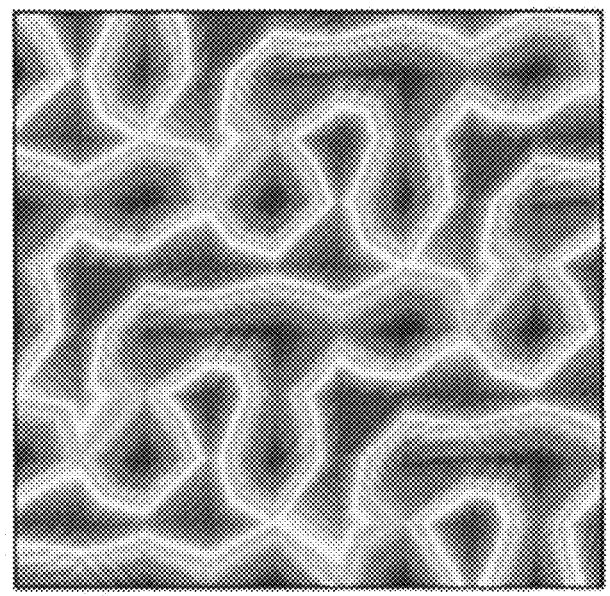
FIG. 9A is a diagram illustrating the order of shots.
FIG. 9B is a diagram illustrating a distribution of writing positional errors.

FIG. 9A illustrates a second shot order J2 for the pixels in the grid composed of 10×10 pixels. The second shot order J2 differs from the first shot order J1. In the second shot order J2, a pixel irradiated with the j-th (1≤j≤50) shot in the first shot order J1 is irradiated with the (j+50)-th shot, and a pixel irradiated with the j-th (51≤j≤100) in the first shot order J1 is irradiated with the (j−50)-th shot. In this example, the shot number of each of the pixels in the grid in the first shot order J1 differs from that in the second shot order J2.

FIG. 9B illustrates a distribution of writing positional errors in the grid subjected to irradiation in the second shot order J2.

Control is performed such that one stripe region 52 is subjected to at least two writing operations and such that one grid is subjected to writing in different shot orders.

Figure 10A:
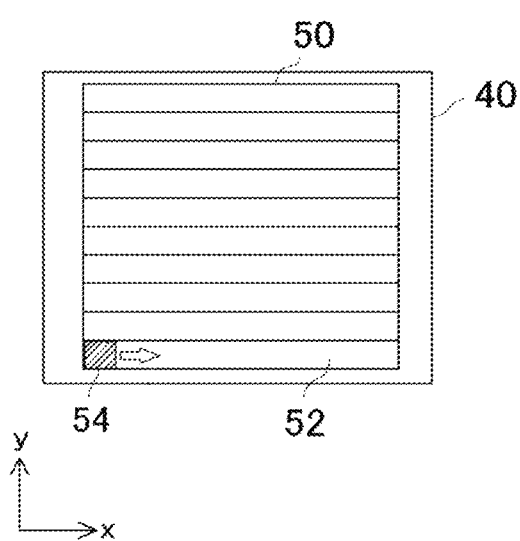
FIGS. 10A and 10B are diagrams each illustrating a direction in which a writing process proceeds.

For example, as illustrated in FIG. 10A, the irradiation region 54, which can be irradiated with the multiple beams MB at a time, is adjusted to and positioned at the left end of the stripe region 52. Then, writing is started. Moving the XY stage 32 in the −x direction causes writing to proceed relatively in the x direction. At this time, the beams are applied in the first shot order J1. Hereinafter, one-time writing in the stripe region 52 will also be referred to as one pass.

Figure 10B:
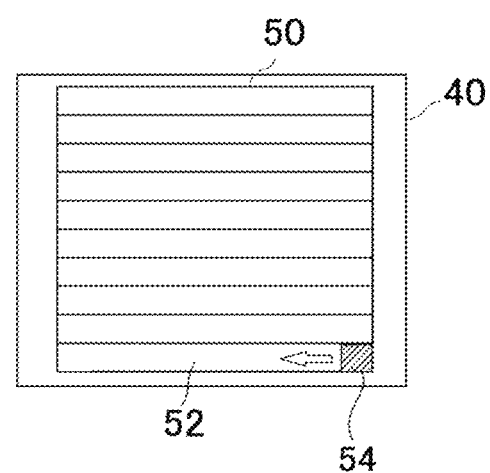

After completion of the first writing (first pass) in the stripe region 52, as illustrated in FIG. 10B, the irradiation region 54 is adjusted to and positioned at the right end of the same stripe region 52. Moving the XY stage 32 in the x direction causes writing (second pass) to proceed relatively in the −x direction. At this time, the beams are applied in the second shot order J2.

One grid is irradiated with the beams applied in the first shot order J1 and the second shot order J2, thereby writing a pattern. As illustrated in FIG. 11, positional errors in the shot orders are added to cancel each other.

The first shot order J1 and the second shot order J2 are calculated in advance by simulation and are stored as shot order data in the storage unit 102. In this case, the second shot order J2 is preferably determined to cancel writing positional errors in writing in the first shot order J1. For example, the second shot order J2 may be determined based on the first shot order J1 obtained by simulation such that the second shot order J2 is the reverse of the first shot order. Furthermore, the second shot order J2 may be obtained by dividing the grid by 2×2 pixels and interchanging the shot numbers of the pixels diagonally arranged in the four pixels.

The control unit 100 reads the shot order data from the storage unit 102, causes a grid of one stripe region 52 in the first writing in the stripe region 52 to be irradiated with the beams in the first shot order J1, and causes the same grid in the second wiring to be irradiated with the beams in the second shot order J2. This causes writing positional errors depending on the shot orders to cancel each other, thus preventing a reduction in writing accuracy.

The above-described embodiment illustrates the exemplary writing algorithm in which pixels in grids, obtained by division of a writing area by a beam pitch of multiple beams, are irradiated with the beams in different shot orders. The writing area may be divided by a size or a unit based on the writing algorithm, such as an integral multiple of (e.g., two times) the beam pitch or an integral submultiple (e.g., one half) of the beam pitch, into multiple rectangular regions. A subset or all of the pixels in each rectangular region are irradiated with the multiple beams in the first shot order and are then irradiated with the beams in the second shot order different from the first shot order. For irradiation of a subset of the pixels in the rectangular region, gaps may be compensated for by multiple writing.

As illustrated in the above-described embodiment, the first pass writing is performed in the first shot order J1 while the XY stage 32 is being moved in the −x direction, and the second pass writing is performed in the second shot order J2 while the XY stage 32 is being moved in the x direction. The first pass writing and the second pass writing may be performed while the XY stage 32 is being moved in the −x direction. The first pass writing and the second pass writing may be performed while the XY stage 32 is being moved in the x direction.

In this case, it is preferred that the origin point of each stripe region in the first pass coincide with that in the second pass without being deviated from each other in the y direction.

In the above-described embodiment, the configuration includes the deflectors 28 and 29 arranged in two stages, and the deflector 29 moves the beams within a grid while the deflector 28 is performing tracking control. The configuration may include a single deflector.

In multi-pass writing in the same stripe region through a single beam writing apparatus, the shot order may be changed for each pass.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-charged-particle-beam writing method comprising:
   performing a tracking operation such that, while a substrate placed on a stage moving continuously is being irradiated with multiple beams including a plurality of charged particle beams, deflection positions of the multiple beams follow movement of the stage; and
   applying the multiple beams to the substrate having a writing area including a plurality of rectangular regions arranged in a mesh during the tracking operation such that each of the plurality of rectangular regions is irradiated with the multiple beams,
   wherein each rectangular region includes a plurality of pixels each having a predetermined size and arranged in a mesh, and
   wherein at least one subset of the plurality of pixels is irradiated with the multiple beams in a first shot order and is then irradiated with the multiple beams in a second shot order different from the first shot order.

2. The method according to claim 1,
   wherein the writing area includes a plurality of stripe regions each having a predetermined width,
   wherein each of the plurality of stripe regions is irradiated with the multiple beams in multiple passes, and
   wherein irradiation with the multiple beams in a first pass is performed in the first shot order, and irradiation with the multiple beams in a second pass is performed in the second shot order.

3. The method according to claim 2, wherein a direction in which writing proceeds in one stripe region in the first pass differs from a direction in which writing proceeds in the stripe region in the second pass.

4. The method according to claim 2, wherein an origin point of the stripe region in the first pass coincides with an origin point of the stripe region in the second pass.

5. The method according to claim 1,
   wherein the tracking operation is performed by using a first deflector, and
   wherein irradiation positions in the rectangular region are shifted by using a second deflector.

6. The method according to claim 1, wherein the second shot order is a reverse of the first shot order.

7. A multi-charged-particle-beam writing apparatus comprising:
   a writer performing a tracking operation such that, while a substrate placed on a stage moving continuously is being irradiated with multiple beams including a plurality of charged particle beams, deflection positions of the multiple beams follow movement of the stage, and applying the multiple beams to the substrate having a writing area including a plurality of rectangular regions arranged in a mesh during the tracking operation such that each of the plurality of rectangular regions is irradiated with the multiple beams, each rectangular region including a plurality of pixels each having a predetermined size and arranged in a mesh; and
   a controller controlling the writer such that at least one subset of the plurality of pixels is irradiated with the multiple beams in a first shot order and is then irradiated with the multiple beams in a second shot order different from the first shot order.

8. The apparatus according to claim 7,
   wherein the writing area includes a plurality of stripe regions each having a predetermined width,
   wherein the controller controls the writer such that each of the plurality of stripe regions is irradiated with the multiple beams in multiple passes, irradiation with the multiple beams in a first pass is performed in the first shot order, and irradiation with the multiple beams in a second pass is performed in the second shot order.

9. The apparatus according to claim 8, wherein the controller controls the writer such that a direction in which writing proceeds in one stripe region in the first pass differs from a direction in which writing proceeds in the stripe region in the second pass.

10. The apparatus according to claim 8, wherein the controller controls the writer such that an origin point of the stripe region in the first pass coincides with an origin point of the stripe region in the second pass.

11. The apparatus according to claim 7, further comprising:
    a first deflector configured to perform the tracking operation; and
    a second deflector configured to shift irradiation positions in the rectangular region.

12. The apparatus according to claim 7, wherein the second shot order is a reverse of the first shot order.

* * * * *